(12) United States Patent
Chen et al.

(10) Patent No.: US 11,641,710 B1
(45) Date of Patent: May 2, 2023

(54) CIRCUIT BOARD GROUND VIA PATTERNS FOR MINIMIZING CROSSTALK BETWEEN SIGNAL VIAS

(71) Applicant: Dell Products L.P., Round Rock, TX (US)

(72) Inventors: James Chen, New Taipei (TW); Mallikarjun Vasa, Secunderabad (IN); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/516,038

(22) Filed: Nov. 1, 2021

(51) Int. Cl.
*H05K 1/02* (2006.01)
*H05K 3/42* (2006.01)

(52) U.S. Cl.
CPC ............. *H05K 1/0222* (2013.01); *H05K 3/42* (2013.01)

(58) Field of Classification Search
CPC .... H05K 1/0251; H05K 1/025; H05K 1/0253; H05K 1/0222; H05K 3/4061; H05K 3/4069; H05K 3/42; H05K 3/421; H05K 3/429
See application file for complete search history.

(56) References Cited

U.S. PATENT DOCUMENTS

2011/0256327 A1\* 10/2011 Mundt ...................... B32B 3/02
428/34.1
2020/0337148 A1\* 10/2020 Kumar ................. H05K 1/0225

\* cited by examiner

*Primary Examiner* — Jeremy C Norris
(74) *Attorney, Agent, or Firm* — Jackson Walker L.L.P.

(57) ABSTRACT

A circuit board may include a first signal via electrically coupled to multiple layers of the circuit board, a second signal via electrically coupled to multiple layers of the circuit board, and a pair of ground vias configured to provide electrical shielding between the first signal via and the second signal via, the pair of ground vias comprising a first ground via electrically coupled to a ground or power plane of the circuit board and a second ground via electrically coupled to the ground or power plane of the circuit board. The first signal via, the first ground via, and the second ground via may be arranged such that they form an angle of approximately 50 degrees having a vertex at the first signal via, a first ray extending from the first signal via through the first ground via and a second ray extending from the first signal via through the second ground via.

9 Claims, 5 Drawing Sheets

CIRCUIT BOARD GROUND VIA PATTERNS FOR MINIMIZING CROSSTALK BETWEEN SIGNAL VIAS

TECHNICAL FIELD

The present disclosure relates in general to information handling systems, and more particularly to systems and methods for forming ground via patterns in a circuit board in order to minimize crosstalk between signal vias of the circuit board.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may include one or more circuit boards operable to mechanically support and electrically couple electronic components making up the information handling system. For example, circuit boards may be used as part of motherboards, memories, storage devices, storage device controllers, peripherals, peripheral cards, network interface cards, and/or other electronic components. As is known in the art, a circuit board may comprise a plurality of conductive layers separated and supported by layers of insulating material laminated together, with conductive traces disposed on and/or in any of such conductive layers.

A circuit board may have numerous electrically-conductive conduits, including traces, vias, pads, and/or other electrically-conductive conduits. A via may comprise a substantially electrically conductive material and may be formed such that vias may electrically couple together traces on different layers of circuit board, thus allowing signals to propagate between layers of circuit board.

Circuit board signal vias may be a source of unwanted noise, impedance discontinuities, and electromagnetic interference. Circuit boards often employ local ground vias proximate to signal vias in order to control the impedance noise and minimize coupling to neighboring signal vias.

FIG. 4 illustrates an example via grounding scheme, as is known in the art. In the approach shown in FIG. 4, ground vias 2 may be placed in-line with signal vias 4.

FIG. 5 illustrates another example via grounding scheme, as is known in the art. In the approach shown in FIG. 5, a pair of ground vias 2 may be placed at an arbitrary angle from each of neighboring signal vias 4.

However, these traditional approaches have disadvantages. As shown in FIG. 6, when ground vias 2 are placed in-line with signal vias 4 as in the approach of FIG. 4, strong lateral electrical fields 6 between adjacent signal vias 4 may still form around ground vias 2, resulting in electrical coupling between adjacent signals pairs or "crosstalk" that may degrade signal integrity. Furthermore, as shown in FIG. 7, in the approach set forth in FIG. 5, strong electrical fields 6 between adjacent signal vias 4 may still form in the area between ground vias 2, resulting in crosstalk between adjacent signals pairs which may also degrade signal integrity.

SUMMARY

In accordance with the teachings of the present disclosure, the disadvantages and problems associated with existing circuit board techniques may be reduced or eliminated.

In accordance with embodiments of the present disclosure, a circuit board may include a first signal via electrically coupled to two or more layers of the circuit board, a second signal via electrically coupled to two or more layers of the circuit board, and a pair of ground vias configured to provide electrical shielding between the first signal via and the second signal via, the pair of ground vias comprising a first ground via electrically coupled to either a ground plane or a power plane of the circuit board and a second ground via electrically coupled to either the ground plane or the power plane of the circuit board. The first signal via, the first ground via, and the second ground via may be arranged such that they form an angle of approximately 50 degrees having a vertex at the first signal via, a first ray extending from the first signal via through the first ground via and a second ray extending from the first signal via through the second ground via.

In accordance with these and other embodiments of the present disclosure, a method may include forming a first signal via electrically coupled to two or more layers of a circuit board and forming a second signal via electrically coupled to two or more layers of the circuit board, and forming a pair of ground vias configured to provide electrical shielding between the first signal via and the second signal via, the pair of ground vias comprising a first ground via electrically coupled to either a ground plane or a power plane of the circuit board and a second ground via electrically coupled to either the ground plane or the power plane of the circuit board. The method may further include arranging the first signal via, the first ground via, and the second ground via such that they form an angle of approximately 50 degrees having a vertex at the first signal via, a first ray extending from the first signal via through the first ground via and a second ray extending from the first signal via through the second ground via.

In accordance with these and other embodiments of the present disclosure, an information handling system may include an enclosure and a circuit board housed in the enclosure, the circuit board comprising a first signal via electrically coupled to two or more layers of the circuit board, a second signal via electrically coupled to two or more layers of the circuit board, and a pair of ground vias configured to provide electrical shielding between the first signal via and the second signal via, the pair of ground vias comprising a first ground via electrically coupled to either a ground plane or a power plane of the circuit board and a second ground via electrically coupled to either the ground plane or the power plane of the circuit board. The first signal via, the first ground via, and the second ground via may be arranged such that they form an angle of approximately 50 degrees having a vertex at the first signal via, a first ray extending from the first signal via through the first ground via and a second ray extending from the first signal via through the second ground via.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
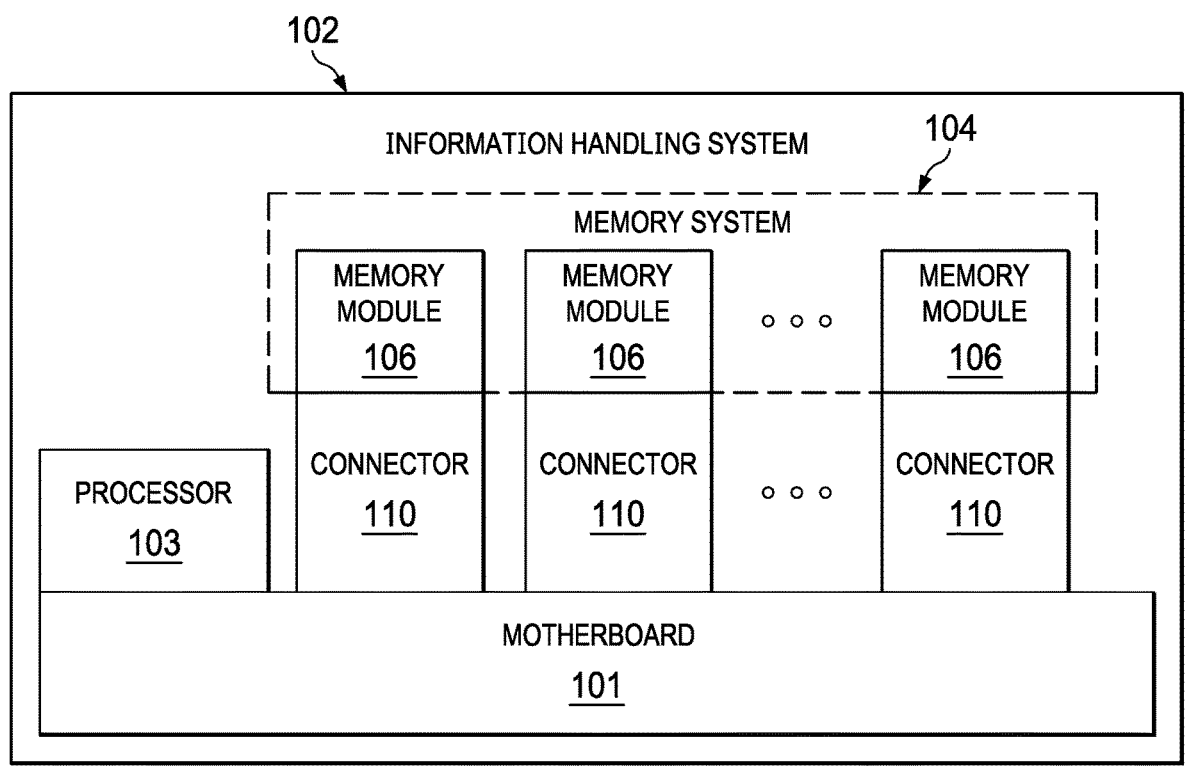
FIG. 1 illustrates a block diagram of an example information handling system, in accordance with embodiments of the present disclosure.
Figure 2:
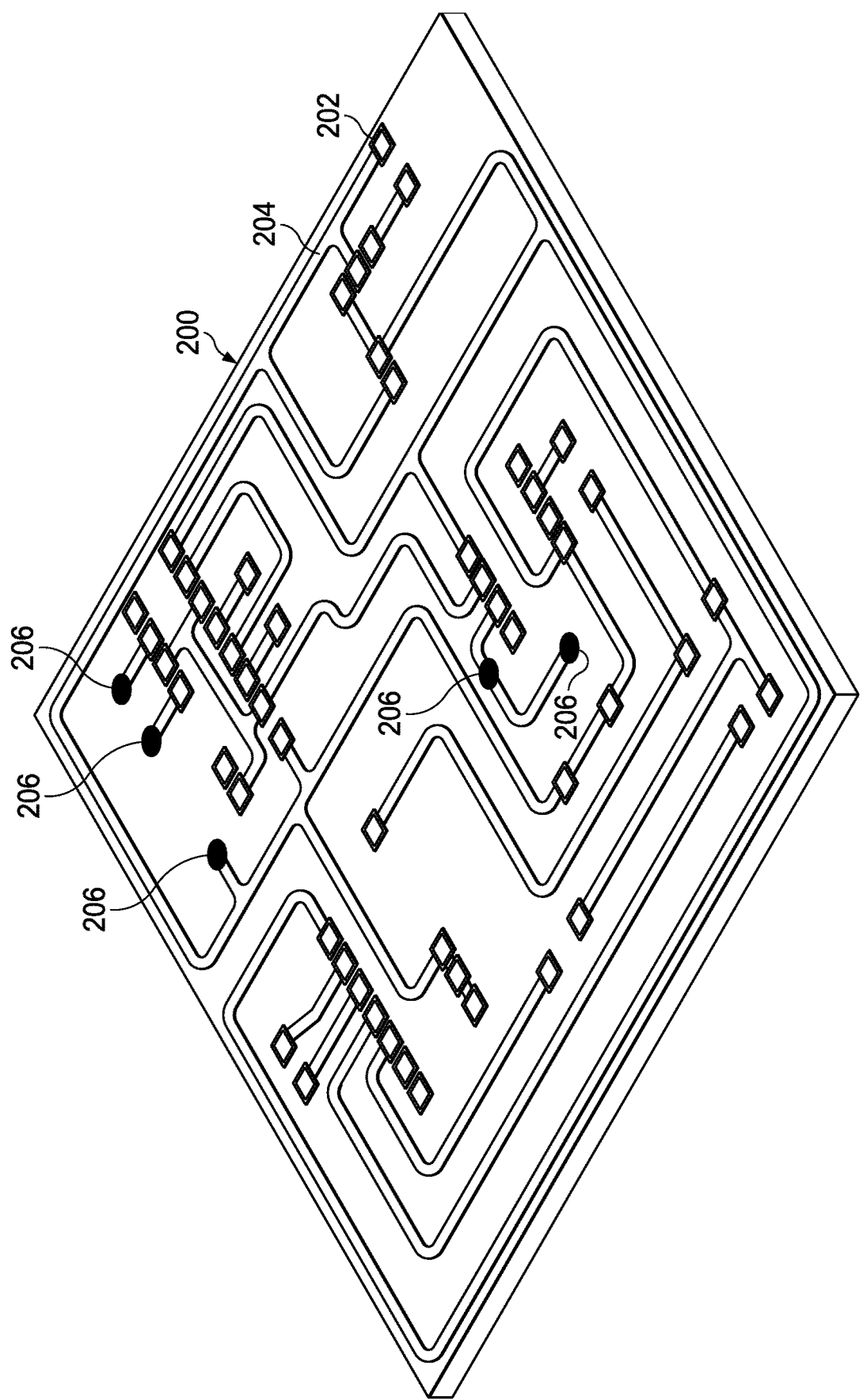
FIG. 2 illustrates a perspective view of an example circuit board, in accordance with embodiments of the present disclosure.
Figure 3:
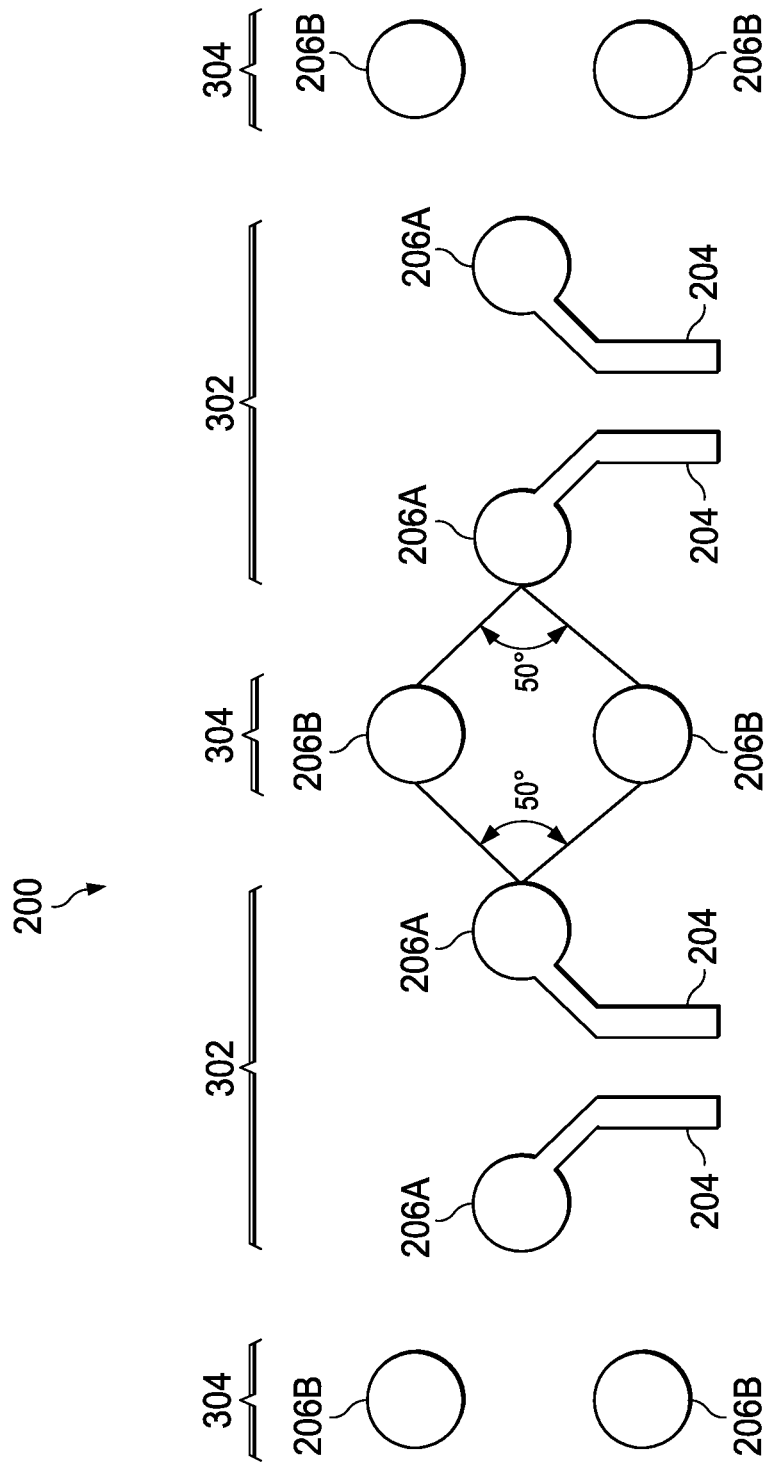
FIG. 3 illustrates a plan view of a portion of a top surface of an example circuit board comprising pairs of signal vias shielded by a pattern of ground vias, in accordance with embodiments of the present disclosure.
Figure 4:
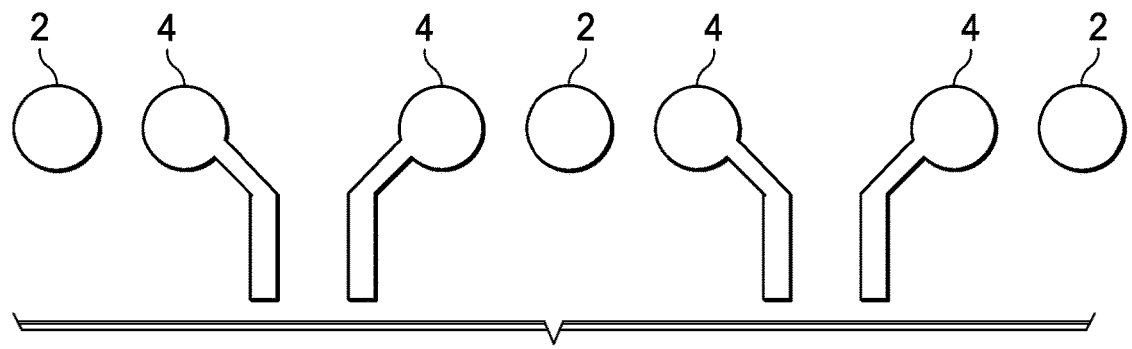
FIG. 4 illustrates a plan view of a portion of a top surface of an example circuit board comprising pairs of signal vias shielded by ground vias in-line with the signal vias, as is known in the art.
Figure 5:
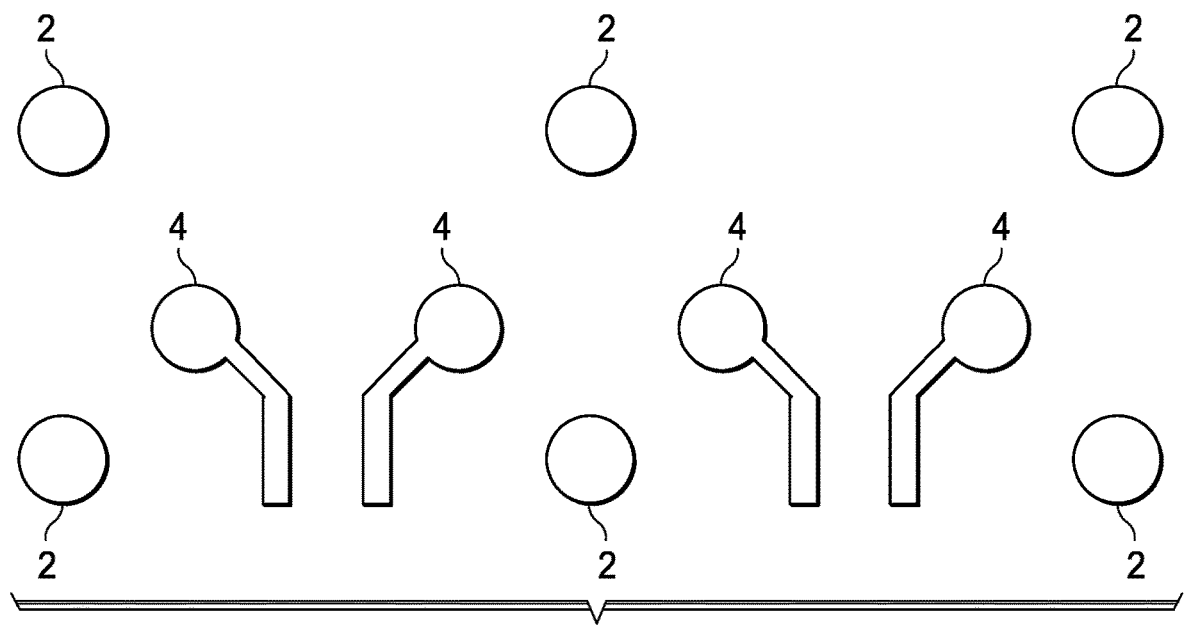
FIG. 5 illustrates a plan view of a portion of a top surface of another example circuit board comprising pairs of signal vias shielded by respective pairs of ground vias, as is known in the art.
Figure 6:
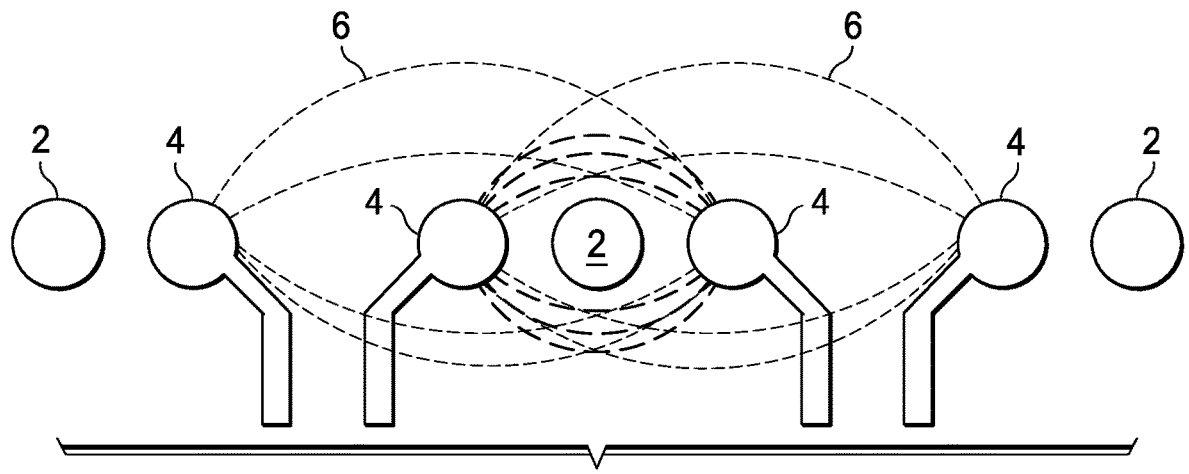
FIG. 6 illustrates the plan view of FIG. 4 annotated with example electrical fields that may form between signal pairs, as is known in the art.
Figure 7:
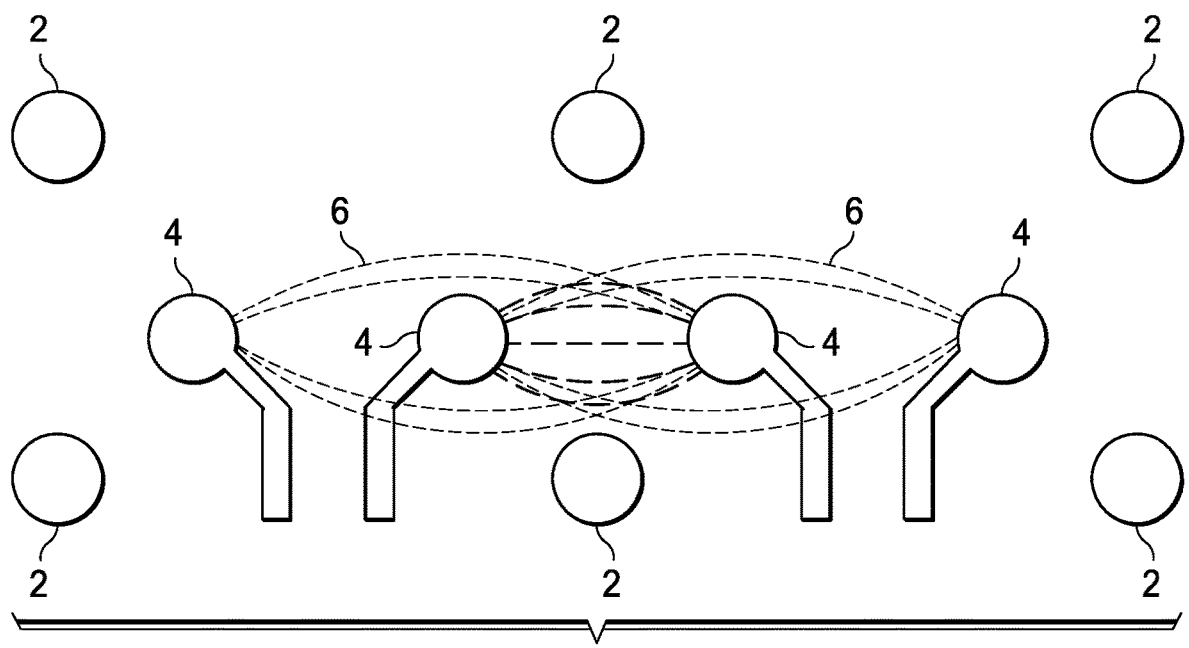
FIG. 7 illustrates the plan view of FIG. 5 annotated with example electrical fields that may form between signal pairs, as is known in the art.

Preferred embodiments and their advantages are best understood by reference to FIGS. 1 through 3, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

As discussed above, an information handling system may include one or more circuit boards operable to mechanically support and electrically connect electronic components making up the information handling system (e.g., packaged integrated circuits). Circuit boards may be used as part of motherboards, memories, storage devices, storage device controllers, peripherals, peripheral cards, network interface cards, and/or other electronic components. As used herein, the term "circuit board" includes printed circuit boards (PCBs), printed wiring boards (PWBs), etched wiring boards, and/or any other board or similar physical structure operable to mechanically support and electrically couple electronic components.

FIG. 1 illustrates a block diagram of an example information handling system 102, in accordance with embodiments of the present disclosure. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer.

As shown in FIG. 1, information handling system 102 may include a motherboard 101, a processor 103 coupled to motherboard 101, a plurality of connectors 110 mechanically and electrically coupled to motherboard 101, and memory system 104 comprising a plurality of memory modules 106 each electrically coupled to motherboard 101 via a respective connector 110. Motherboard 101 may comprise a circuit board configured to provide structural support for one or more information handling resources of information handling system 102 and/or electrically couple one or more of such information handling resources to each other and/or to other electric or electronic components external to information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource, memory system 104, and/or another component of information handling system 102.

Memory system 104 may be communicatively coupled to processor 103 and may comprise any system, device, or apparatus operable to retain program instructions or data for a period of time (e.g., computer-readable media). Memory system 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory system 104 may comprise dynamic random access memory (DRAM).

As shown in FIG. 1, memory system 104 may be implemented by a plurality of memory modules 106 removably coupled to connectors 110. Each memory module 106 may include any system, device or apparatus configured to retain program instructions and/or data for a period of time (e.g., computer-readable media). A memory module 106 may comprise a dual in-line package (DIP) memory, a dual-inline memory module (DIMM), a Single In-line Pin Package (SIPP) memory, a Single Inline Memory Module (SIMM), a Ball Grid Array (BGA), or any other suitable memory module. In some embodiments, a memory module 106 may include a mating edge connector configured to mechanically and electrically couple to a corresponding receptacle slot or other opening of a connector 110. In some embodiments, a memory module 106 may be implemented using a circuit board.

A connector 110 may comprise any system, device, or apparatus fixedly mounted on motherboard 101 and may be constructed to mechanically couple a corresponding memory module 106 to motherboard 101 and to electrically couple such memory module 106 to motherboard 101, processor 103, and/or other components of information handling system 102. Connector 110 may comprise a socket including a receptacle slot or other opening configured to removably receive a corresponding mating edge connector of a memory module 106.

In addition to motherboard 101, processor 103, connectors 110, and memory modules 106, information handling system 102 may include one or more other information handling resources, including one or more other information handling resources implemented in whole or part using circuit boards.

FIG. 2 illustrates a perspective view of an example circuit board 200, in accordance with embodiments of the present disclosure. Circuit board 200 or a circuit board similar to circuit board 200 may be used to implement at least a portion of motherboard 101, a memory module 106, and/or other information handling resources of information handling system 102. As depicted in FIG. 2, circuit board 200 may include a plurality of pads 202, traces 204, and vias 206. Pads 202 may comprise a conductive material and may be formed on a surface of circuit board 200. Further, each pad 202 may be operable to receive a pin of an electronic component (e.g., a packaged integrated circuit) and provide electrical connectivity between the pin and one or more traces 204. Traces 204 may comprise a conductive material and may be formed on a surface of circuit board 200, or in a layer of circuit board 200 not visible from the surface thereof. Further, each trace 204 may be operable to provide conductive pathways between electronic components mounted to pads 202.

Although FIG. 2 depicts pads 202 and traces 204 on the top surface of circuit board 200 visible in FIG. 2, it is understood that pads 202 and traces 204 may also be disposed on the bottom surface of circuit board 200. In addition, circuit board 200 may comprise a plurality of conductive layers separated and supported by layers of insulating material laminated together, and traces 204 may be disposed on and/or in any of such conductive layers. Connectivity between pads 202 and/or traces 204 disposed on and/or in various layers of circuit board 200 may be provided by vias 206 extending between multiple layers of circuit board 200.

The various pads 202, traces 204, and vias 206 may comprise silver, copper, aluminum, lead, nickel, other metals, metal alloys, and/or any other conductive material that may readily conduct electrical current.

Although not explicitly shown in FIG. 2, vias 206 may comprise either signal vias or ground vias. Ground vias may comprise those vias 206 communicatively coupled to pads and/or traces that convey electrical signals that represent information. On the other hand, ground vias may comprise those vias 206 that do not carry information, but are instead coupled to either a ground plane layer or a power plane layer of circuit board 200 and are present to provide shielding between adjacent signal vias, in order to reduce electrical coupling or crosstalk between adjacent signal vias.

FIG. 3 illustrates a plan view of a portion of a top surface of circuit board 200 comprising pairs 302 of signal vias 206A shielded by a pattern of ground vias 206B, in accordance with embodiments of the present disclosure. Each pair 302 may comprise a differential signal pair. As shown in FIG. 3, the pattern of ground vias 206B may take the form of pairs 304, the ground vias 206B of each pair 304 arranged relative to adjacent signal vias 206A such that an approximate 50-degree angle is formed with respect to each signal via 206A of the adjacent signal vias 206A, such angle having a vertex at a signal via 206A, having a first ray extending from the signal via 206A through a first ground via 206B of the pair, and a second ray extending from the signal via 206A through a second ground via of the pair.

As stated above, the via pattern described above leads to the formation of angles of "approximately" 50 degrees. "Approximate" and "approximately" as used to describe such angles may be understood to mean that such angles may be 50 degrees plus or minus manufacturing tolerances that may cause such angles to deviate from 50 degrees. For example, a manufacturing tolerance of ±3 mils due to via misregistration may lead to a variance of the angles of ±3 degrees from the desired 50 degrees.

The formation of vias 206 in such a pattern may optimally block straight fields between adjacent signal vias 206A while also eliminating or minimizing strong fields passing around ground vias 206B.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A circuit board, comprising:
    a first signal via electrically coupled to two or more layers of the circuit board;
    a second signal via electrically coupled to two or more layers of the circuit board;
    a third signal integral to a signal pair comprising the first signal via and the third signal via; and
    a pair of ground vias configured to provide electrical shielding between the first signal via and the second signal via, the pair of ground vias comprising:
        a first ground via electrically coupled to either a ground plane or a power plane of the circuit board; and
        a second ground via electrically coupled to either the ground plane or the power plane of the circuit board;
    wherein the first signal via, the first ground via, and the second ground via are arranged such that they form an angle of approximately 50 degrees having a vertex at the first signal via, a first ray extending from the first signal via through the first ground via and a second ray extending from the first signal via through the second ground via.

2. The circuit board of claim 1, wherein the second signal via, the first ground via, and the second ground via are arranged such that they form a second angle of approximately 50 degrees having a vertex at the second signal via, a first ray extending from the second signal via through the first ground via and a second ray extending from the second signal via through the second ground via.

3. The circuit board of claim 1, wherein the second signal via is integral to a second signal pair comprising the second signal via and a fourth signal via.

4. A method, comprising:
    forming a first signal via electrically coupled to two or more layers of a circuit board;
    forming a second signal via electrically coupled to two or more layers of the circuit board;
    forming a third signal via integral to a signal pair comprising the first signal via and the third signal via;
    forming a pair of ground vias configured to provide electrical shielding between the first signal via and the second signal via, the pair of ground vias comprising:
        a first ground via electrically coupled to either a ground plane or a power plane of the circuit board; and
        a second ground via electrically coupled to either the ground plane or the power plane of the circuit board; and
    arranging the first signal via, the first ground via, and the second ground via such that they form an angle of approximately 50 degrees having a vertex at the first signal via, a first ray extending from the first signal via through the first ground via and a second ray extending from the first signal via through the second ground via.

5. The method of claim 4, further comprising arranging the second signal via, the first ground via, and the second ground via such that they form a second angle of approximately 50 degrees having a vertex at the second signal via, a first ray extending from the second signal via through the first ground via and a second ray extending from the second signal via through the second ground via.

6. The method of claim 4, wherein the second signal via is integral to a second signal pair comprising the second signal via and a fourth signal via.

7. An information handling system comprising:
    an enclosure; and
    a circuit board housed in the enclosure, the circuit board comprising:
        a first signal via electrically coupled to two or more layers of the circuit board;
        a second signal via electrically coupled to two or more layers of the circuit board;
        a third signal integral to a signal pair comprising the first signal via and the third signal via; and a pair of ground vias configured to provide electrical shielding between the first signal via and the second signal via, the pair of ground vias comprising:
- a first ground via electrically coupled to either a ground plane or a power plane of the circuit board; and
- a second ground via electrically coupled to either the ground plane or the power plane of the circuit board;

wherein the first signal via, the first ground via, and the second ground via are arranged such that they form an angle of approximately 50 degrees having a vertex at the first signal via, a first ray extending from the first signal via through the first ground via and a second ray extending from the first signal via through the second ground via.

8. The information handling system of claim 7, wherein the second signal via, the first ground via, and the second ground via are arranged such that they form a second angle of approximately 50 degrees having a vertex at the second signal via, a first ray extending from the second signal via through the first ground via and a second ray extending from the second signal via through the second ground via.

9. The information handling system of claim 7, wherein the second signal via is integral to a second signal pair comprising the second signal via and a fourth signal via.

* * * * *